United States Patent [19]

Anderson et al.

[11] Patent Number: 5,108,792
[45] Date of Patent: Apr. 28, 1992

[54] DOUBLE-DOME REACTOR FOR SEMICONDUCTOR PROCESSING

[75] Inventors: Roger N. Anderson, Santa Clara, Calif.; John G. Martin, Cranford, N.J.; Douglas Meyer, Tempe, Ariz.; Daniel West, Sunnyvale, Calif.; Russell Bowman; David V. Adams, both of San Jose, Calif.

[73] Assignee: Applied Materials, Inc., Santa Clara, Calif.

[21] Appl. No.: 491,416

[22] Filed: Mar. 9, 1990

[51] Int. Cl.⁵ ........................................... C23C 16/00
[52] U.S. Cl. ................................. 427/248.1; 118/715; 118/725
[58] Field of Search ........................... 118/715, 725; 427/248.1

[56] References Cited

U.S. PATENT DOCUMENTS

| | | | |
|---|---|---|---|
| 3,627,590 | 12/1971 | Mammel | 118/725 |
| 4,524,719 | 6/1985 | Campbell | 118/725 |
| 4,539,933 | 9/1985 | Campbell | 118/725 |
| 4,545,327 | 10/1985 | Campbell | 118/725 |
| 4,796,562 | 1/1989 | Brors et al. | 118/725 |

Primary Examiner—Richard Bueker
Attorney, Agent, or Firm—Robert J. Stern; Clifton Anderson

[57] ABSTRACT

A thermal reactor for epitaxial deposition on a wafer comprises a double-dome vessel and dual heat sources. Each heat source comprises inner and outer circular arrays of infrared lamps. Circumferential heating uniformity is assured by the cylindrical symmetry of the vessel and the heating sources. Radial heating uniformity is provided by independent control of inner and outer heating arrays for both the top and bottom heat sources. The relative temperatures of wafer and susceptor are controlled by adjusting relative energies provided by the upper and lower heat sources so that backside migration. Reduced pressure operation is provided for by the convex top and bottom domes. Due to the provided control over transmitted energy distribution, a susceptor can have low thermal mass so that elevated temperature can be achieved more quickly and cooling can be facilitated as well. This improves throughput and reduces manufacturing costs per wafer. Reagent gas introduction can be axial or radial as desired.

13 Claims, 5 Drawing Sheets

DOUBLE-DOME REACTOR FOR SEMICONDUCTOR PROCESSING

BACKGROUND OF THE INVENTION

The present invention relates to semiconductor processing and, more particularly, to thermal reactors for chemical vapor deposition, thermal annealing, and other procedures requiring high temperature processing. A major objective of the present invention is an improved thermal reactor for semiconductor processing which provides for high throughput, flexible thermal control, and process uniformity for large wafers at ambient and reduced pressures.

Recent technological progress is closely identified with the increasing miniaturization of electronic circuits made possible by advances in semiconductor processing. Certain advanced processing techniques require exposing a semiconductor structure to a reactant gas under carefully controlled conditions of elevated temperature, sub-ambient pressures, and uniform reactant gas flow. Examples of such processes include low-pressure chemical vapor deposition, reduced-pressure chemical vapor deposition, and selective epitaxial deposition.

The economics of integrated circuit manufacture have favored increasing wafer diameters. Early wafers had diameters of 2" and less, while the trend today is to 8" and above. The trend toward larger wafer sizes is moderated by the added difficulty of obtaining uniform gas flow and heating required for high yields. Uniform gas flow is addressed by careful selection of reaction chamber geometry and the manner in which gases are introduced into and exhausted from the chamber; temperature uniformity has been addressed by supporting wafers with large thermal susceptors which distribute heat evenly over time and space. A major problem with large mass susceptors is the time they require to be heated and cooled. This increased time adversely affects wafer throughput and, thus, manufacturing costs.

A reactor system for implementing ambient and sub-ambient pressure thermal reactions typically includes a reactor vessel, a gas source, an exhaust system, a heat source, and a coolant source. The reactor vessel, which typically has quartz walls, defines a reaction chamber which serves as a controlled environment for the desired reaction. The gas source provides purging and reactant gases, while the exhaust system removes spent gases and maintains the desired ambient and sub-ambient pressures. The heat source, which can be an array of infrared lamps or an inductive source, generally transmits energy through the chamber wall to heat the wafer. Generally, the wafer is mounted on a support structure, which can serve as a susceptor to absorb energy transmitted into the chamber and conduct the resulting heat to the wafer being processed. In some reactor systems, the support can rotate the wafer within the chamber to minimize the effect of spatial anomalies within the chamber. Coolant can be directed against the chamber wall to minimize its thermal expansion and distortion. Coolant is also used after processing to speed the return of the reactor to room temperature.

Reaction chamber walls are typically cylindrical over a substantial portion of the chamber length, e.g., as in a bell jar chamber. Cylindrical vessels are the vessels of choice for low pressure applications since they distribute stress due to pressure differential uniformly and do so in spite of variations in wall thickness. The even distribution of stress minimizes the probability of breakage.

Ambient pressure thermal reactors exist which use rectangular quartz chambers to provide uniform reactant gas flow across a wafer. However, these are not reduced pressure or low pressure capable. The pressure differential across a flat surface would cause localized stress and subject it to breakage.

Stressing of flat and other non-cylindrical walls due to pressure differential can be addressed by using greater wall thicknesses or other reinforcement means. However, thick walls provide too much thermal insulation. The effectiveness of the external coolant, typically air, in reducing chamber wall temperatures would be reduced, leading to increased chemical deposition on the inner surfaces of the wall. Additional design objectives result in conflicting preferences between thin chamber walls, to reduce wall deposits, versus thicker walls to reduce pressure-caused stresses.

Susceptors, which are typically of graphite, often contain silicon from previous depositions. This silicon can migrate to the backside of a wafer when the susceptor is hotter than the wafer. This backside migration is generally considered undesirable. For example, backside transport is that it can disturb a dielectric seal previously applied to a wafer. In some cases, backside migration can be used advantageously to seal dopant in a wafer.

In most thermal reactors, backside migration is limited by heating the wafer and susceptor slowly so that no large temperature differentials are formed. Thus, control of backside migration, in addition to the requirement of uniform temperatures, imposes limitations on the rate at which a thermal reactor can be heated to a desired processing temperature. Furthermore, conventional reactors do not permit the relative temperature of wafer and susceptor to be varied precisely. Therefore, it is difficult to implement backside migration selectively so that dopant sealing can be implemented when desired.

What is needed is a thermal reactor system for semiconductor processing which provides for high-throughput thermal processing of large wafers. The high throughput must be achieved in connection with gas flow uniformity and thermal uniformity for high yields. Adjustment of relative wafer and susceptor temperatures, and thus control of backside migration, should be provided. Both ambient and reduced pressure processing capability are desired.

SUMMARY OF THE INVENTION

In accordance with the present invention, a thermal reactor for semiconductor processing uses a double-dome reactor vessel in which a wafer is held perpendicular to the vessel axis. Independently controlled heat sources can provide radiation through respective domes, enhancing thermal uniformity during heating. Each heat source can include independently controllable inner and outer heater element circular arrays. A motor driven shaft can extend through an axial aperture in one of the domes to rotate the wafer holder. The wafer holder can include a low thermal mass susceptor to facilitate uniform heating of the wafer.

Depending on the specific realization of the invention, reactant gas can be introduced axially or radially for uniform gas flow at the wafer surface. Radial introduction and exhaust can be implemented through a gas manifold situation between the vessel domes. Axial gas introduction can be made through an axially centered aperture in one of the domes. A barrier between the domes can be used to segregate the chamber into two sections. Reactant gas flows through an upper section containing the wafer to be processed. The reactant gas is partly confined to the upper section by the pressure of a purge gas flowing through the lower section.

In accordance with the method of the present invention, a wafer is mounted within a double-dome vessel. The wafer is positioned and oriented perpendicular to the axis of the double-dome vessel. Herein, "perpendicular" means "orthogonal and intersection". Preferably, the vessel axis extends through the geometric center of the wafer and of a susceptor on which the wafer is mounted. Energy is radiated into the chamber through both domes. Gas flow over the wafer can be introduced axially, through a dome aperture, or radially, through a gas manifold situated between the domes. In either case, gas can be exhausted radially through the gas manifold.

The double-dome vessel more closely resembles a sphere than a cylinder. Just as a sphere has cylindrical symmetry, so does a double-dome structure. Thus, the present vessel shares the characteristic of cylindrical symmetry with several vessel configurations employed in the prior art while employing a distinctive geometry. The closest prior art would appear to be the bell-jar which has a dome top and a cylindrical sidewall. Typically, wafers are mounted in a bell jar reactor orthogonal to, but not perpendicular to the dome axis, i.e., the axis does not pass through the wafers. In a bell-jar chamber, gas is introduced and exhausted axially. Radiant heating is provided only on one side of the wafer, and a high thermal mass susceptor is required to ensure uniform heating.

The present invention provides for short processing cycles while maintaining processing uniformity. Heat can be transmitted efficiently into the reaction chamber. The distribution of the heat so transmitted can be controlled with sufficient precision that temperature gradients through the wafer are minimized during heating. The double-dome geometry of the reactor vessel distributes pressure differentials effectively, so that the thickness of the quartz constituting the domes can be kept minimal, thus, minimizing radiant transmission losses and enhancing transmission efficiency.

The heat source can have an overall cylindrical symmetry which matches that of the chamber so that circumferential gradients ($dT/d\theta$) through the wafer are inherently small. The relative radiant energy between inner and outer heating element arrays for each heat source can be adjusted to minimize radial gradients ($dT/dr$). The relative total contributions from each heat source can be adjusted to minimize thickness gradients ($dT/dz$) and/or to facilitate or inhibit silicon transport, as desired.

The present invention provides for a range of dome shapes. One or both domes can be semispherical, in part or in total. A cylindrical section can extend to the rim from a semispherical top or a flat top. Generally, a dome is a shape which if mated with its reflection in a plane perpendicular to its axis of cylindrical symmetry would define an enclosed space, whether or not the enclosure is complete.

Since the present invention provides for precise control of the instantaneous heating profile for a wafer, there is less need to rely on the thermal mass of the susceptor to ensure uniform heating. As result a susceptor with relatively small thermal mass can be used. A susceptor with low thermal mass can be heated more quickly, decreasing the time for the desired processing temperature to be attained. Furthermore, a low thermal mass susceptor cools more quickly, further decreasing processing times. In one of its realizations, the present invention provides for a reactor system without a susceptor so that heating and cooling times are limited primarily by the thermal mass of the wafer. These and other features and advantages of the present invention are apparent from the description below with reference to the following drawings.

DESCRIPTION OF THE PREFERRED EMBODIMENTS

Figure 1:
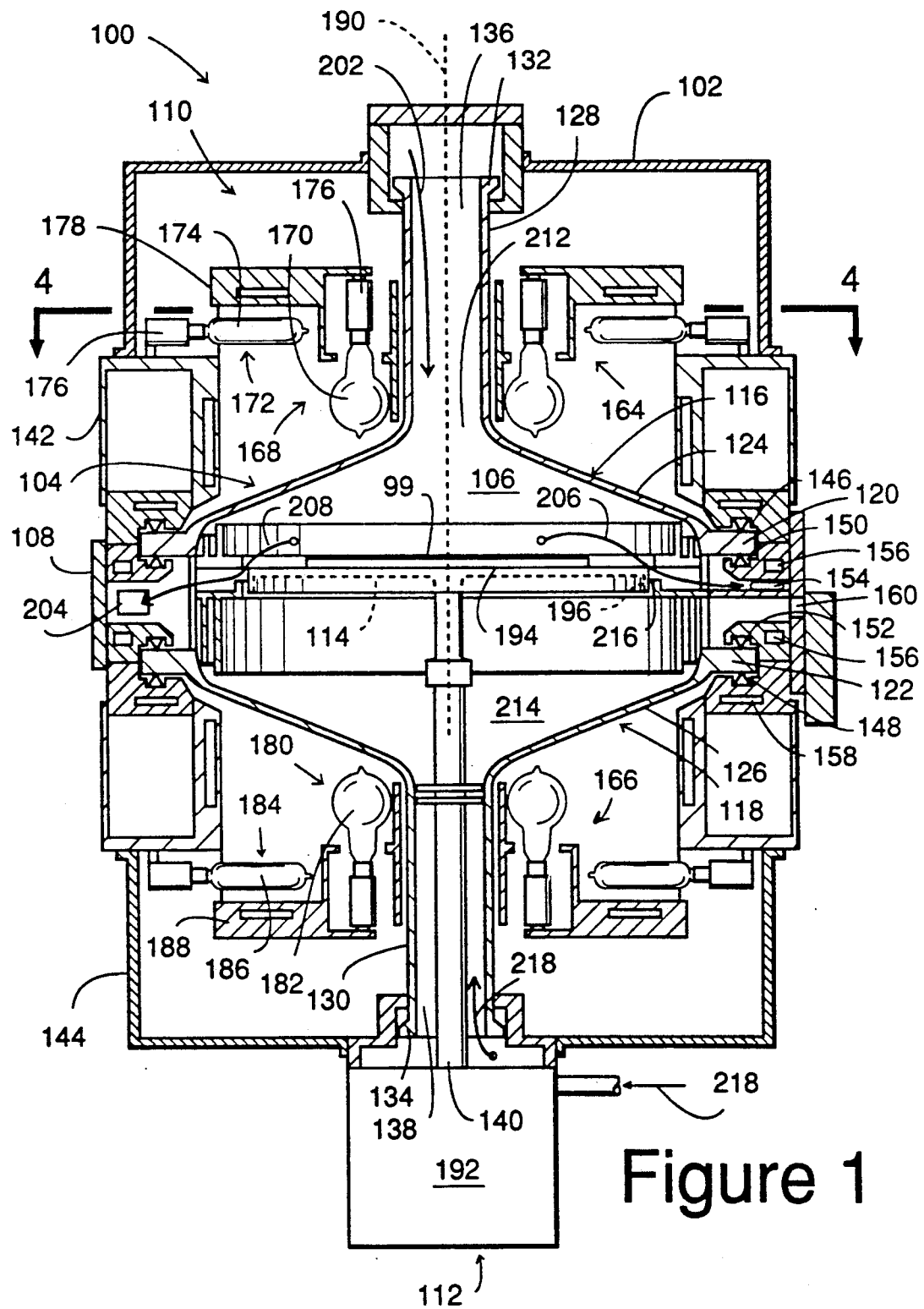
FIG. 1 is a sectional view of a thermal reactor in accordance with the present invention.
Figure 2:
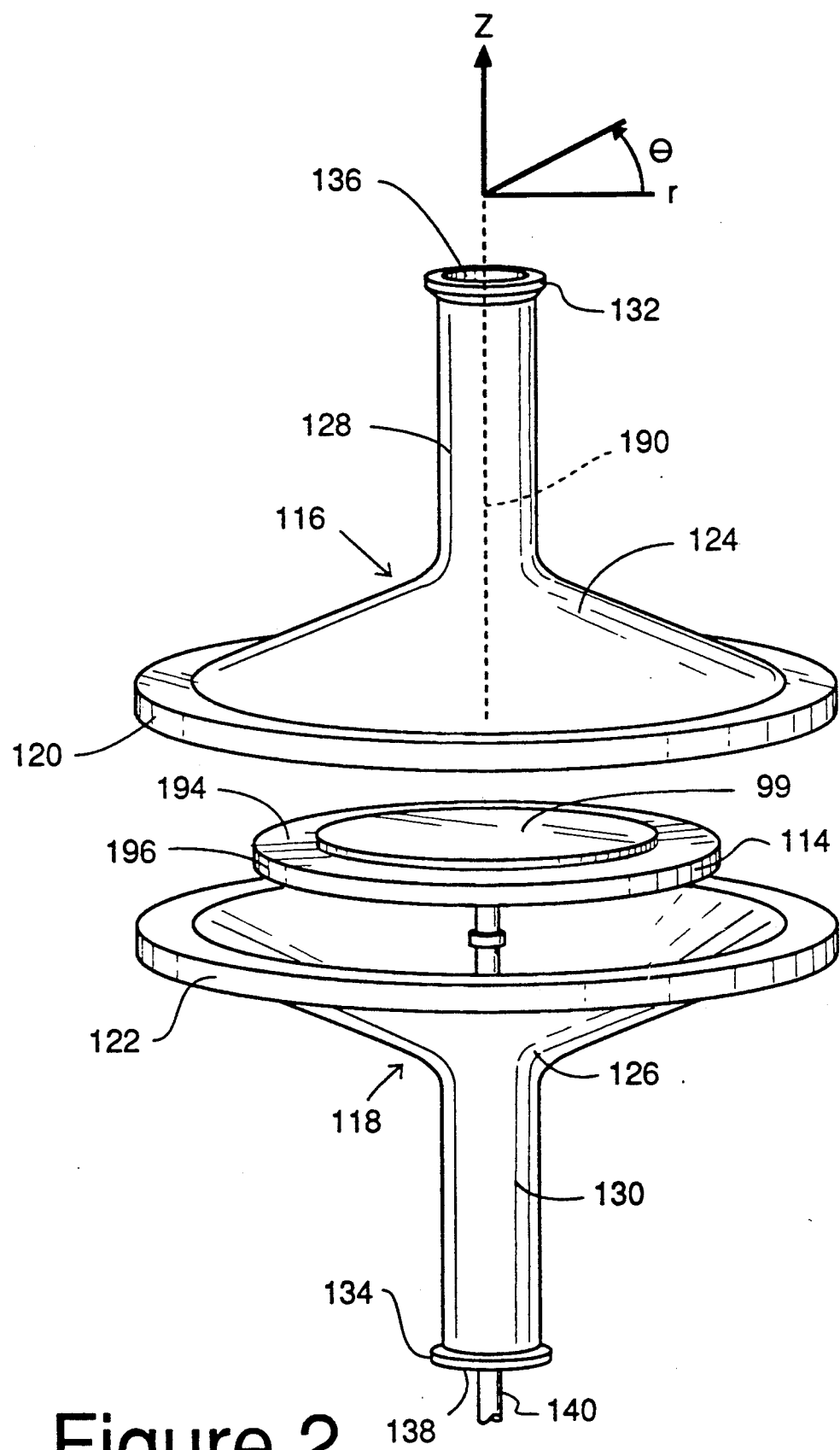
FIG. 2 is an exploded view showing selected components of the reactor of FIG. 1.

In accordance with the present invention, a thermal reactor 100 for processing a semiconductor wafer 99 comprises a housing 102, a double-dome reactor vessel 104 defining a reaction chamber 106 and including a manifold 108, a heating system 110, a drive assembly 112, and a susceptor 114, as shown in FIG. 1. Double-dome vessel 104 includes a top dome 116 and a bottom dome 118. Each dome 116, 118 respectively includes a flange 120, 122, a convex section 124, 126, a neck 128, 130, and a lip 132, 134 defining an aperture 136, 138, as shown in FIG. 2. Top aperture 136 can be used for the introduction of reactant gas. Bottom aperture 138 admits a shaft 140 of drive assembly 112. Shaft 140 is coupled to rotate susceptor 114 and thus wafer 99 mounted thereon during processing to enhance process uniformity.

Figure 3:
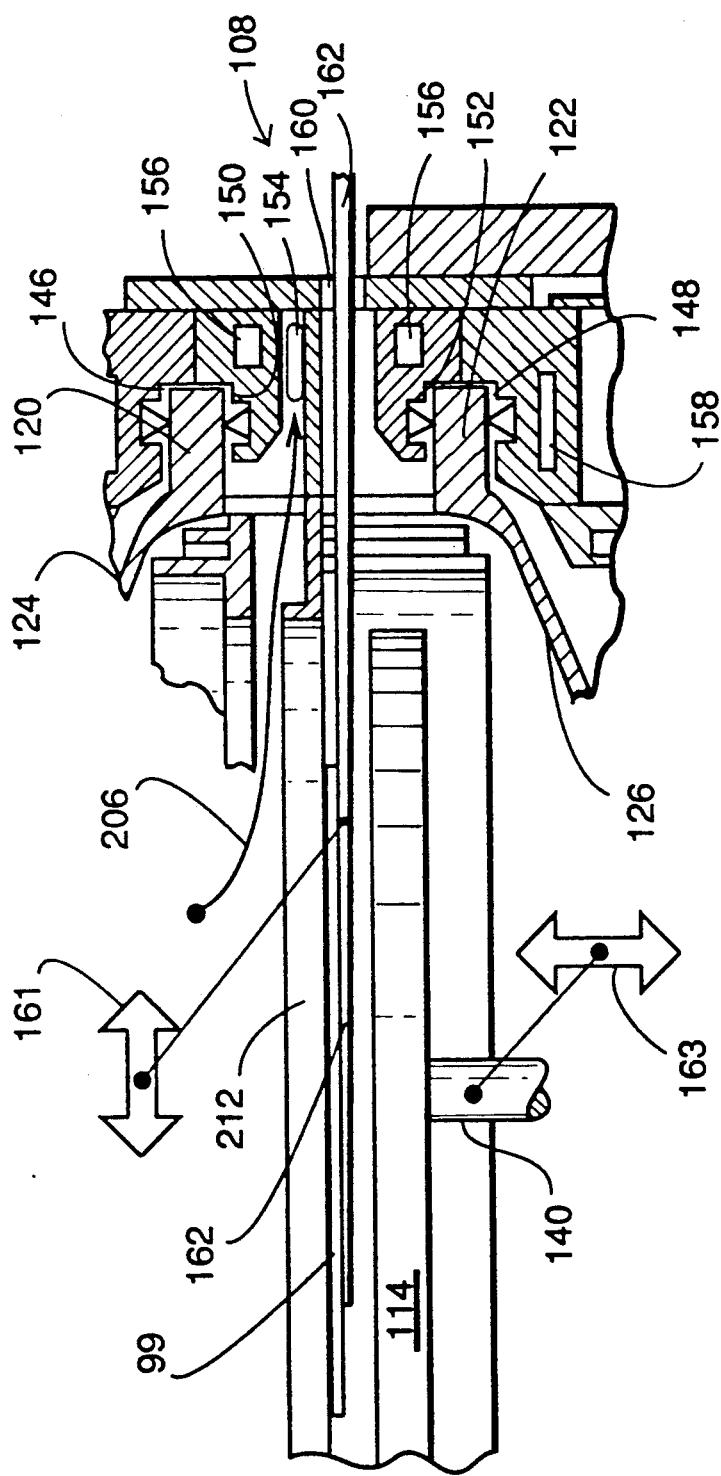
FIG. 3 is a detailed sectional view of a manifold of the thermal reactor of FIG. 1.

Housing 102 comprises an upper housing section 142 and a low housing section 144, as shown in FIG. 1. Dome flanges 120 and 122 mate with corresponding recesses 146 and 148 of housing sections 142 and 144 and recesses 150 and 152 in manifold 108, as shown in FIGS. 1 and 3. Also shown in FIG. 3 are a reactant gas exhaust channel 154, coolant channels 156, and a purge exhaust channel 158. An entrance 160 allows a robot arm 162 to introduce and to remove wafer 99 using a lateral motion indicated by lateral double arrow 161. Drive assembly 112, FIG. 1, causes susceptor 114 to lower, as indicated by a vertical double arrow 161, so that robot arm 162 can access the top of susceptor 114.

Heating system 110 comprises an upper heat source 163 and a lower heat source 166. Upper heat source 164 includes an inner array 168 of infrared radiation bulbs 170 and an outer array 172 of infrared radiation bulbs 174. Electrical interfacing for bulbs 170 and 174 is provided by sockets 176. Upper heat source also includes a reflector structure 178 which provides for mechanical attachment of bulbs 170 and 174 as well as reflective surfaces to enhance the directivity of heat source 164. Likewise, lower heat source 166 includes an inner array 180 of infrared bulbs 182, an outer array 184 of bulbs 186, and a reflector structure 188, as shown in FIG. 1. The circular character of arrays 168 and 172 of upper heat source 164 is evident from FIG. 4, which may be considered representative of similar arrays 180 and 184 of lower heat source 166.

By transmitting heat both from above and from below wafer 99, greater total energy can be achieved for a given maximum local energy. High local energies are to be avoided because they can cause the heat sources and chamber walls to heat unevenly and possibly break. Greater total energy is desired to provide more rapid heating of chamber 106. It is apparent from FIG. 1 that a large percentage of the surface area of vessel 104 can be used to transit energy to wafer 99.

Another advantage of using upper and lower heat sources 164 and 166 is that the relative temperatures of wafer 99 and susceptor 114 can be controlled. Accordingly, heating sources 164 and 166 can be adjusted so that wafer 99 remains hotter than susceptor 114, avoiding backside migration. Where backside migration is desired, for example to seal dopant in wafer 99, lower heat source 166 can operate at relatively a higher level so that susceptor 114 is hotter than wafer 99.

Figure 4:
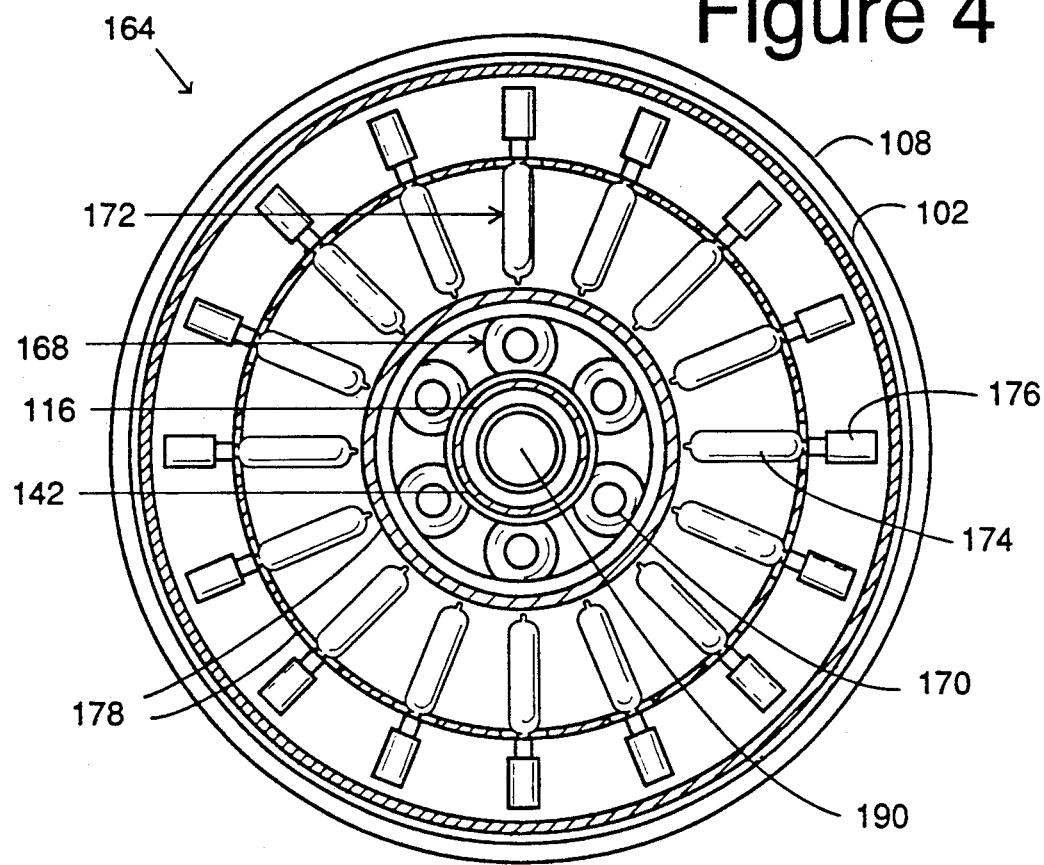
FIG. 4 is a sectional view taken along line 4—4 of FIG. 1 showing one of two similar heat sources of the reactor of FIG. 1.

Thermal reactor 100 is characterized by a high degree of cylindrical symmetry since domes 116 and 118, susceptor 114, wafer 99, and heat sources 164 and 166 are coaxial about a common axis 190, shown in FIGS. 1 and 4. Accordingly, circumferential uniformity of temperature of wafer 99 is readily attained. In other words, in the cylindrical (r, $\theta$, z) coordinate system indicated in FIG. 2, at any given radius r of wafer 99, the temperature variations in the $\theta$ direction are negligible. Since arrays 168, 172, 180 and 184 are not continuous, but rather comprise discrete elements (bulbs 170, 174, 182, and 186) some variation of radiant energy in the $\theta$ direction is expected. However, rotation of wafer 99 by a motor 192 of motor drive assembly 112 minimizes this source of variation.

The flexibility to achieve radial uniformity (in the r direction) is provided by the use of dual circular arrays in each heat source 164, 166. For example, the radial profile of radiant heat from upper source 164 can be controlled by adjusting the intensity of inner array 168 relative to that of outer array 172. Likewise, the radial profile of radiant heat from lower source 166 can be controlled by adjusting the intensity of inner array 180 relative to outer array 184. Note that if further control of radial thermal profile is required, heat sources with more circular arrays can be substituted for heat sources 164 and 166. The additional circular arrays, if independently controlled, can provide more flexibility in approximating an ideal radial profile.

The temperature gradient in the z direction is a function of the time required for heat generated at the irradiated wafer and susceptor surfaces to be conducted to the interior of a wafer. By using low levels of radiant energy, the irradiated surfaces can be heated sufficiently slowly that thermal conduction can minimize z direction thermal gradients. However, temperature gradients in the z direction do not affect uniformity between circuits being fabricated on the wafer. Accordingly, z direction uniformity is less critical than uniformity in the r and $\theta$ directions. More important is the z direction gradient between wafer 99 and susceptor 144, which is controlled, as described above, by adjusting the relative levels of heat sources 164 and 166.

Conventional thermal reactors cannot attain the degree of instantaneous radial and circumferential thermal uniformity provided by thermal reactor 100. Accordingly, they rely on susceptors with large thermal mass to absorb most of the radiant energy transmitted into the reaction chamber. Conduction then plays a greater role in heating the wafer so that temperature uniformity can be attained at the expense of slower heating. In addition, the high thermal mass susceptors resist cooling once processing is complete. Thus, the high thermal mass susceptors of conventional thermal reactors lengthen the time required for both heating and cooling a reaction chamber.

Susceptor 114 comprises a thin plate 194 for low thermal mass and a rim 196 for rigidity. The greater level of instantaneous thermal uniformity provided by the present invention permits the use of a low thermal mass susceptor, so that heating and cooling times are minimized. Thus, processing times are reduced, throughputs are increased, and manufacturing costs lowered.

Thermal reactor 100 also provides flexibility in reactant gas flow patterns. Arrow 202 in FIG. 1 indicates an axial introduction of reactant gas through aperture 136 of top dome 116. Spent reactant gases can be exhausted out a circular array of ports to channels 154 and 204 of manifold 108 as indicated by arrows 206 and 208. This flow pattern provides a high degree of flow uniformity in the $\theta$ direction. Radial uniformity is basically controlled by the geometry of vessel 104 and reagent gas flow rates.

Figure 5:
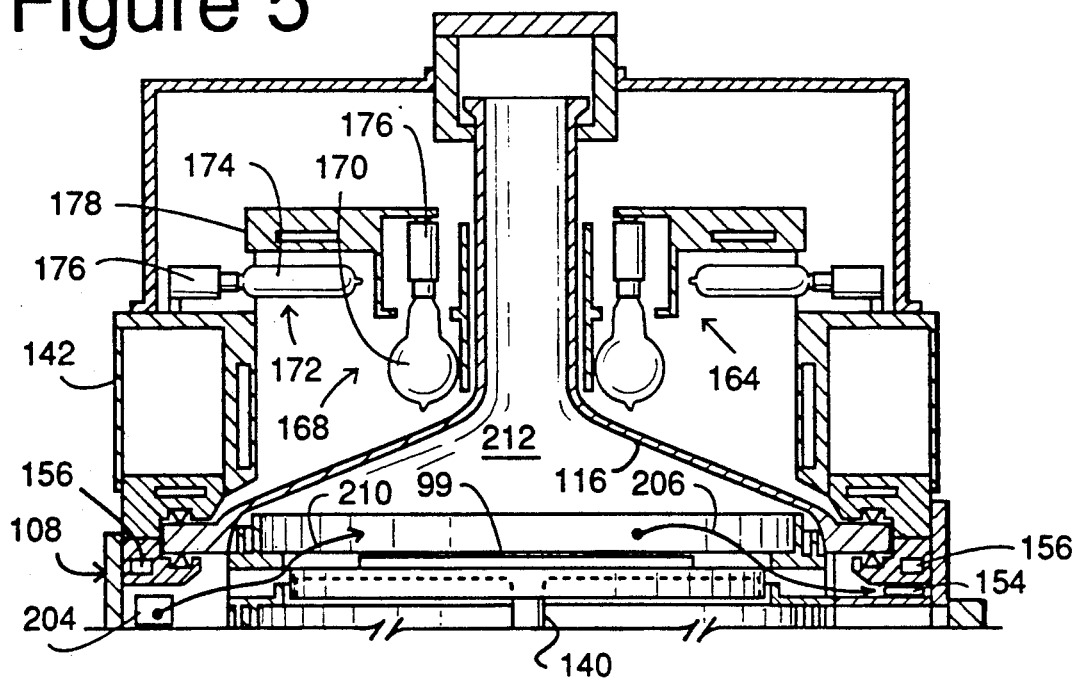
FIG. 5 is a section view of the top half of the reactor of FIG. 1 showing an operation mode in which reactant gas is introduced axially rather than radially, as in FIG. 1.

An alternative reagent flow mode is illustrated in FIG. 5. Reagent gas is admitted, as indicated by arrow 210, through channel 204 on one side of manifold 108 and exhausted, as indicated by arrow 206, through channel 154, on the other side of manifold 108. This produces a generally planar, and therefore relatively uniform, flow across wafer 99. Further radial uniformity is provided by rotation of wafer 99 by motor assembly 112. The selection between radial and axial reactant flow introduction generally depends on the specific reaction being implemented by thermal reactor 100. A top dome with no neck or aperture can be employed where the option of an axial reactant gas introduction is not of interest.

It is generally undesirable for reactant gas to contact surfaces other than the wafer. For example, reactant gas for an epitaxial deposition can deposit silicon on heated surfaces other than the wafer. Moreover, reactant gases can corrode reactor components. While some contact is inevitable, thermal reactor 100 substantially confines reactant gas to an upper section 212 of chamber 106, and excludes it from a lower section 214, as indicated in FIG. 1. To this end, a barrier 216, shown in FIGS. 1 and 3, conforms to susceptor 114. When susceptor 114 is in the operating position of FIG. 1, it cooperates with barrier 216 to separate sections 212 and 214.

Since susceptor 114 rotates relative to barrier 216, the separation is not gas tight. Accordingly, a purge gas is introduced, as indicated by arrows 218, through lower aperture 138 to equalize pressures between sections 212 and 214, and thereby minimize the flow of reactant gas into lower section 214. This keeps lower section components, including shaft 140, the underside of susceptor 114, and motor 192, relatively free of contamination by reactant gas. The purge gas is exhausted via purge gas channel 158 of manifold 108.

Figure 6:
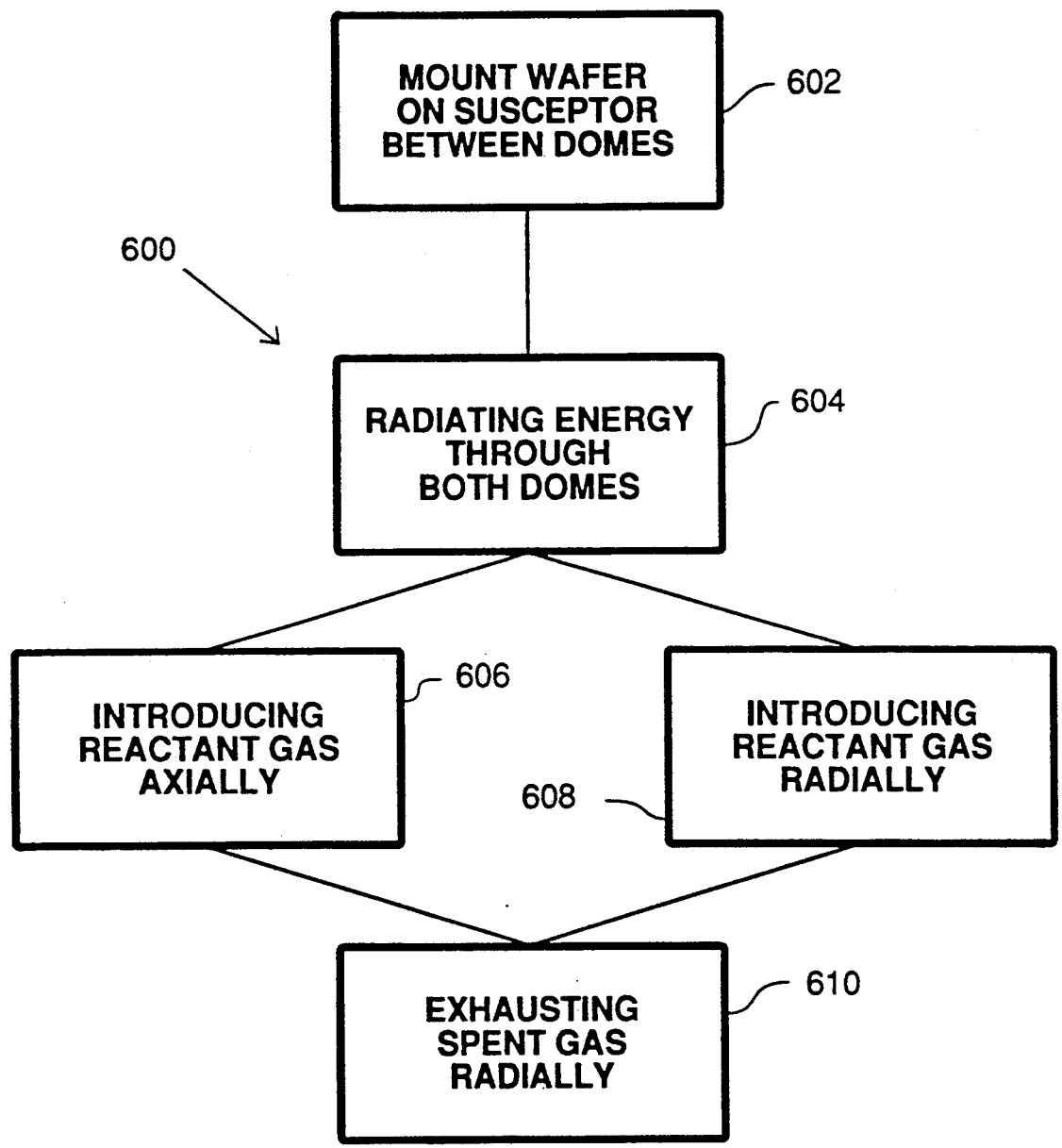
FIG. 6 is a flow chart of a method in accordance with the present invention and practiced using the reactor of FIG. 1.

A method 600 practiced using reactor 100 and depicted in FIG. 6 proceeds as follows:

1) mounting, at 602, wafer 99 on susceptor 114 between domes 116 and 118;
2) radiating, at 604, energy into chamber 106 through both domes 116 and 118;
3) introducing reactant gas into chamber 106
   a) axially, at 606, through aperture 136, or
   b) radially, at 608, through channel 204; and
4) exhausting, at 610, spent reactant gas radially.

A key feature of thermal reactor 100 is that it can be operated at reduced pressures, which are required for certain reactions, including some preferred epitaxial depositions. The generally convex form of domes 116 and 118 is effective at withstanding pressure differentials between chamber 106 and the exterior of vessel 104. Since the geometry inherently handles reduced pressures effectively, convex sections 124 and 126 can employ thinner quartz walls than would be used by a vessel with a less favorable geometry.

The thinner quartz is a more efficient heat transfer medium so that less energy is absorbed by the quartz. The quartz vessel therefore remains cooler. Since vessel 104 remains relatively cool, there is a reduction of depositions, e.g., of silicon during an epitaxial deposition, which might impair its transmissivity.

Unlike convex sections 124 and 126, necks 128 and 130 are not used to transmit radiant energy into chamber 106. Therefore, they can be shielded by reflector structures 178 and 188, respectively to limit heat accumulation therein.

The present invention provides for further variations on the embodiments described above. Identical or different dome geometries can be used for the top and bottom domes. The dome shape can be nearly conical or have a more semispherical form. Necks and apertures can be included or excluded. The vessel can provide for inverted or non-inverted wafer processing. Different heat source arrangements can be used and the top and bottom heat sources need not be similar. A heat source can include one or more circular bulbs to provide radiation in a circumferentially uniform distribution. Different reactant and purge gas flow patterns can be used. These and other variations upon and modifications to the disclosed embodiments are provided for by the present invention, the scope of which is limited only by the following claims.

What is claimed is:

1. A reactor for semiconductor processing comprising:

a reactor vessel defining a reactor chamber, said reactor vessel having a first dome and a second dome, said second dome opposing said first dome, said first and second domes being mechanically coupled so that they share a common axis of cylindrical symmetry;

wafer holding means for holding a wafer having a first face and a second face, said wafer holding means holding said wafer so that said faces are perpendicular to said axis;

a first heat source external to said chamber and arranged to radiate energy through said first dome toward said wafer; and a second heat source external to said chamber and arranged to radiate energy through said second dome toward said wafer; and gas handling means for introducing gases into and evacuating gases from said chamber.

2. A reactor as recited in claim 1 wherein said holding means includes a susceptor in contact with said second face of said wafer.

3. A reactor as recited in claim 1 wherein said heating means includes thermal control means for controlling the relative energy contributions of said first and second heat sources.

4. A reactor as recited in claim 3 wherein each of said heat sources includes a respective inner circular array of heating elements and a respective outer circular array of heating elements, said thermal control means controlling the relative energy contributions of the inner and outer arrays for each of said heat sources.

5. A reactor for semiconductor processing comprising:

a reactor vessel defining a reactor chamber, said reactor vessel having a first dome and a second dome, said second dome opposing said first dome, said first and second domes being mechanically coupled so that they share a common axis of cylindrical symmetry;

wafer holding means for holding a wafer having a first face and a second face, said wafer holding means holding said wafer so that said faces are perpendicular to said axis;

heating means for heating said wafer; and gas handling means for introducing gases into and evacuating gases from said chamber, said gas handling means including a barrier defining a first section and a second section of said chamber, said first section being at least partly bounded by said first dome, said second section being at least partly bounded by said second dome, said gas handling means being adapted for introducing reactant gas into said first section and nonreactant gas into said second section;

whereby, said nonreactant gas inhibits the flow of reactant gas into said second section.

6. A reactor for semiconductor processing comprising:

a reactor vessel defining a reactor chamber, said reactor vessel having a first dome and a second dome, said second dome opposing said first dome, said first and second domes being mechanically coupled so that they share a common axis of cylindrical symmetry;

wafer holding means for holding a wafer having a first face and a second face, said wafer holding means holding said wafer so that said faces are perpendicular to said axis;

heating means for heating said wafer; and gas handling means for introducing gases into and evacuating gases from said chamber, said gas handling means including a gas manifold disposed between said first and second domes and mechanically coupled to each of them.

7. A reactor as recited in claim 6 wherein said second dome includes a second dome aperture about said axis, said wafer holding means including wafer rotation means for rotating said wafer, said wafer rotating means including a motor external to said chamber and mechanically coupled to said susceptor by a shaft through said second dome aperture.

8. A reactor as recited in claim 6 wherein said gas handling means introduces reactant gas through said gas manifold.

9. A reactor as recited in claim 6 wherein said first dome includes a first dome aperture about said axis, said gas handling means being coupled to said aperture so that reactant gas can be introduced therethrough.

10. A reactor as recited in claim 9 wherein said gas handling means evacuates gas radially through said gas manifold.

11. A method of processing a semiconductor wafer, said method comprising the steps of:
a) mounting said wafer on a susceptor within a chamber defined by opposing first and second domes; 'b) radiating energy through said first dome toward said wafer and through said second dome toward said susceptor; and
c) introducing reactant gas into said chamber along an axis of cylindrical symmetry of said first dome so that reactant gas flows over said wafer.

12. A method as recited in claim 11 wherein step c involves evacuating gas radially relative to said axis through a gas manifold disposed between and mechanically coupled to said first and second domes.

13. A method of processing a semiconductor wafer, said method comprising the steps of:
a) mounting said wafer on a susceptor within a chamber defined by opposing first and second domes; 'b) radiating energy through said first dome toward said wafer and through said second dome toward said susceptor; and
c) introducing reactant gas radially relative to an axis of cylindrical symmetry of said first dome through a gas manifold disposed between and mechanically coupled to said first and second domes so that reactant gas flows over said wafer.

* * * * *